United States Patent [19]

Calder et al.

[11] Patent Number: 4,680,609
[45] Date of Patent: Jul. 14, 1987

[54] STRUCTURE AND FABRICATION OF VERTICALLY INTEGRATED CMOS LOGIC GATES

[75] Inventors: Iain D. Calder, Nepean; Thomas W. Macelwee; Abdalla A. Naem, both of Ottawa, all of Canada

[73] Assignee: Northern Telecom Limited, Montreal, Canada

[21] Appl. No.: 653,192

[22] Filed: Sep. 24, 1984

[51] Int. Cl.$^4$ .................... H01L 27/02; H01L 29/04; H01L 29/78
[52] U.S. Cl. ........................... 357/42; 357/59; 357/23.7; 357/23.14; 357/23.11
[58] Field of Search .................... 357/42, 23.7, 28.14, 357/59 E, 23.11

[56] References Cited

U.S. PATENT DOCUMENTS 3,967,988  7/1976  Davidsohn ............... 357/23.11
4,555,721  11/1985  Bansal et al. ............ 357/59 E

OTHER PUBLICATIONS

Faggin et al., "Silicon Gate Technology", Solid State Electronics, Pergamon Press 1970, vol. 13, pp. 1125–1144.

*Primary Examiner*—Martin H. Edlow
*Assistant Examiner*—Robert Limanek
*Attorney, Agent, or Firm*—Schwartz, Jeffery, Schwaab, Mack, Blumenthal & Evans

[57] ABSTRACT

A vertically integrated CMOS logic gate has spaced semiconductor layers with control gates located between the layers and insulated from them by gate oxide. Transistors formed in one semiconductor layer are vertically aligned with transistors formed in the other semiconductor layer. Pairs of vertically coincident transistors have common control gates and certain of the pairs have integral drain regions. Transistors in one layer are series connected in an open loop configuration and transistors in the other layer are parallel connected in a closed loop configuration. The logic gate function depends on voltages applied to the common control gates and to the open and closed loops. By the vertical integration, a two-input NAND or NOR gate can be made using less area than that required for two simple MOS transistors.

19 Claims, 29 Drawing Figures

STRUCTURE AND FABRICATION OF VERTICALLY INTEGRATED CMOS LOGIC GATES

This invention relates to the structure and fabrication of vertically integrated CMOS logic gates.

CMOS (complementary metal-oxide-semiconductor) devices and circuits have been developed for their low power, low noise capabilities and their immunity to power supply variations. On the other hand, CMOS circuits are slower than more conventional NMOS circuitry because the p-channel (PMOS) transistor in a CMOS pair is inherently slow. It is also more difficult to make CMOS circuitry very dense because of the need for a p-well in which to form the NMOS transistor of the pair. Finally, an interaction called "latch-up" exists between neighbouring PMOS and NMOS transistors due to the existence of a parasitic npnp silicon controlled switch that can latch into a low resistance state under certain conditions. The last two problems can be solved by using vertically integrated, or stacked structures.

Stacked MOS devices are disclosed in several publications. Gibbons et al, IEEE Electronic Device Letters, EDL-1, page 1 et seq, 1980 describe a CMOS inverter having a common gate for both the n-channel and the p-channel transistor. This stacked inverter has a p-channel transistor in the bulk silicon and a laser recrystallized polysilicon thin film n-channel transistor overlying the p-channel device and separated from it by a common control gate and gate oxide layers.

A similar stacked CMOS inverter has also been proposed by Goeloe et al, IEDM, Washington, D.C., page 554 et seq, 1981. Both of these inverters suffer from low n-channel mobility and high parasitic capacitance since the source and drain of the top n-channel transistors are built on top of the common gate.

A further CMOS inverter is known from Colinge et al, IEEE Electronic Device Letters, EDL-2, page 250 et seq, 1981. In the Colinge et al inverter the top and bottom devices share a common drain contact, the top polysilicon film being in contact with the underlying bulk silicon in the drain region.

Essentially, in these stacked or vertically integrated devices, the upper channel polysilicon is recrystallized into large grains having several grain boundaries which inhibit electrical current flow. Consequently, compared with the underlying bulk silicon, the recrystallized polysilicon has a lower carrier mobility and poorer reproducibility from device to device since the number of grain boundaries varies randomly.

In co-pending U.S. patent application Ser. No. 611,549, filed May 17th, 1984 a process for manufacturing vertically integrated MOS devices and circuits is described. Insulated control gates are formed on a semiconductor substrate such as a silicon substrate and a layer of polysilicon is then deposited over the wafer so that the polysilicon contacts the substrate silicon through windows in the gate oxide. The substrate silicon and the polysilicon are then laser melted and cooled under conditions that encourage single crystal seeding from the substrate into the polysilicon over the common control gates. Subsequently, ions are implanted into both the silicon substrate and the polysilicon to form source and drain regions. By introducing the source and drain dopants after melt-associated seeding of the polysilicon, the risk of dopant diffusion into the device channel regions is avoided.

The inverter is only one of several fundamental logical building blocks or "logic gates" that are assembled into complex digital circuits.

Logic gate structures which are particularly adapted to utilize the advantages inherent in the process described in the above co-pending application are now proposed.

According to one aspect of the invention, there is provided a vertically integrated MOS logic gate comprising first and second active semiconductor layers, one of the active semiconductor layers having an open loop along which are formed a plurality of transistors and the other active semiconductor layer having at least one closed loop in which are formed a plurality of transistors, the transistors in one semiconductor layer being substantially vertically coincident with respective transistors in the other semiconductor layer and having respective common control gates located between the layers, each control gate controlling one vertically coincident transistor pair, each transistor having a source and a drain region separated by a channel region, at least one of the vertically coincident transistor pairs having drain regions contacting one another at a contact zone, a first and a second lead connected to the open loop to connect the open loop transistors in series, and a third and a fourth lead connected to the or each closed loop to connect the closed loop transistors in parallel.

The second and fourth leads are preferably combined as a common output lead connected to the loops at or near said contact zone.

The first semiconductor layer can be a top layer within a semiconductor substrate such as silicon and the second semiconductor layer can be a film of recrystallized polysilicon.

Preferably the open loop is configured as a U-shape and the or each closed loop can be rectangular. For multiple input logic gates, the open loop can have a serpentine configuration of orthogonal segments and a plurality of closed loops can be configured as a ladder formation.

In a logic gate configured with a rectangular closed loop and a U-shaped open loop, opposed limbs of the rectangular loop can be vertically coincident with opposed limbs of the U-shaped loop. In such a structure the transistor control gates preferably extend orthogonally to the opposed limbs of the U- and rectangular loops.

For a logic gate adapted to function as a NAND gate, logic input voltages are applied to respective control gates, the first lead can be connected to ground or negative logic voltage and the third lead is connected to a positive logic voltage.

Alternatively, the logic gate can be configured to function as a NOR gate, the logic input voltages being applied to respective control gates, the first lead being connected to a positive logic voltage and the third lead being connected to ground or a negative logic voltage.

Preferably the vertically integrated MOS logic gate has p-channel transistors within the semiconductor film and n-channel transistors within the semiconductor substrate layer.

In an alternative arrangement in which p-channel transistors are formed within the semiconductor substrate layer and n-channel transistors are formed within the semiconductor film, the positive logic supply is interchanged with the ground/negative logic supply in said NAND and NOR gates.

The commonly controlled transistors are preferably vertically coincident and the control gates are made of polysilicon.

In a multiple input logic gate in which the closed loops are configured as a ladder, alternating rungs can be connected so as to connect the transistors on their drain sides to the output lead and on the source sides to the third lead. The control gates can extend perpendicular to the uprights of the ladder.

In an alternative multi-input logic gate, a plurality of the closed loops are arranged in a ladder configuration with one upright of the ladder connected to the fourth lead and the other upright of the ladder connected to the third lead, the open loop extending in a serpentine fashion back and forth across the ladder configured closed loops, cross parts of the serpentine configuration being coincident with rung parts of the ladder configuration and having coincident transistors formed thereat. The control gates can extend beyond the structure in a direction perpendicular to the uprights of the ladder, and terminate with end portions extending perpendicular to the rungs.

Preferably the output lead and either the first or third leads are regions of doped polysilicon formed from a layer of polysilicon integral with the loop formed within the semiconductor film. The common controlling gates can also be formed of polysilicon.

According to another aspect of the invention, there is provided a process for the fabrication of vertically integrated MOS logic gates comprising the steps of:

forming insulated control on a semiconductor substrate;

forming a semiconductor layer over and insulated from the gates so as to contact the substrate at a contact position;

forming transistors in at least one closed loop in one of the semiconductor layers;

forming transistors in an open loop in the other semiconductor layer such that transistors in one semiconductor layer are vertically coincident with transistors in the other semiconductor layer, each pair of vertically coincident transistors being commonly controlled by one of the control gates, at least one of the transistor pairs having transistor drains in contact with each other at said contact position; and forming leads to the transistors whereby to connect the transistors in one set in series and to connect the transistors in the other set in parallel.

Preferably the process is performed using a silicon substrate, the insulated regions being silicon dioxide, the gates being polysilicon, one of the semiconductor layers being the single crystal silicon substrate and the other semiconductor layer being polysilicon recrystallized into single crystal within the bounds of each transistor. To render the polysilicon layer into large single crystal regions, it is heated and melted to promote corresponding melting of the underlying substrate at the contact point, the molten material then being cooled to promote lateral crystal seeding within the film from the underlying substrate.

Sources and drains for the transistors within the two semiconductor layers can be formed by ion implantation using a plurality of separate implants to achieve the desired concentration of ions at specific depth within both the and substrate silicon.

The loop configurations are designed to minimize the distance between contact point and parts of the polysilicon which are to be melted and recrystallized to form single crystal silicon. Such a configuration preferably has the open loop formed as a U-shape and the closed loop formed as a vertically coincident rectangular configuration. In the case of multiple input logic gates the open loop can be configured as an extended U-shape or can be alternatively configured as a serpentine configuration. Similarly, the plurality of closed loops can be configured as a ladder formation.

The silicon substrate and overlying polysilicon at a seeding source can be melted using a laser. To obtain lateral seeding the laser beam can then be moved away from the seeding source to encourage melting and crystal regrowth above the control gates.

The insulated control gates are preferably formed by initially depositing a first gate oxide layer, then depositing and photodefining a polysilicon layer on the first deposited gate oxide, and subsequently depositing a second gate oxide layer. The contact point can then be provided by etching through the gate oxide to the substrate. The active polysilicon layer is deposited following formation of the contact point window. The single crystal regions can be formed by doping and laser-recrystallizing portions of the active polysilicon layer followed by photodefinition and etching.

Preferably the transistors of the logic gate are formed within a device well bounded by regions of field oxide, the field oxide being relatively thin, of the order of 0.5 microns thick.

Following implantation of ions to form said sources and drains, the wafer can be subjected to a laser annealing step to activate the dopant without excessive diffusion. Regions of the polysilicon layer can be doped and laser annealed to form the conducting parts of the loops and to form the leads to connect parts of the loops to bonding pads or other circuits at remote locations on the wafer.

Embodiments of the invention will now be described by way of example with reference to the accompanying drawings in which.

Figure 1:
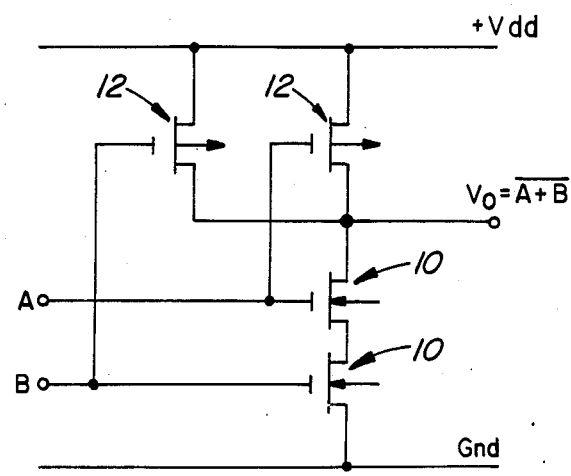
FIG. 1 is a circuit diagram of a two-input NAND gate.

Referring in detail to FIG. 1, the two-input NAND gate has voltage rails at $V_{dd}$ and GROUND and a pair of NMOS transistors 10 series connected between ground and an output terminal indicated as $V_O$, the series connected NMOS transistors having gates controlled by input voltages A and B. The input voltages A and B also control gates of a pair of PMOS transistors 12 connected in parallel between the voltage rail $V_{dd}$ and the output terminal $V_O$. In operation, the logic gate shown in FIG. 1 gives an output $\overline{A+B}$. As shown by the truth table below the output voltage $V_O$ depends on the gate voltages A and B as follows:

| A | B | $V_o$ |
|---|---|---|
| 0 | 0 | 1 |
| 0 | 1 | 1 |
| 1 | 0 | 1 |
| 1 | 1 | 0 |

Conventional NAND gates are configured in a single layer of semiconductor and all of the individual features of the logic gate take up a certain part of the semiconductor area.

Referring now to FIGS. 2 to 5 there is shown a vertically integrated or stacked implementation of the NAND function shown schematically in FIG. 1. The NAND logic gate has two transistors formed within a semiconductor substrate 14, the transistors having sources 16, 17 and drains 18, 19 linked by channel regions 20. An upper semiconductor layer has two transistors with sources 21, 22 and drains 23, 24 linked by channel regions 25. At a level intermediate the transistors, insulated control gates 27, 28 extend between the channel regions of the respective transistor pairs. In the second level of semiconductor, doped conducting regions 30, 32 form leads to the source 21 and drain 24 respectively of the two upper transistors. A third lead 34 extends through a contact window 36 to contact a portion 38 of the substrate semiconductor electrically connected to the conducting link 26.

In the substrate, sources 16 and 17 and drains 18 and 19 are electrically connected by conducting links 26. In the upper semiconductor layer, source 22 is electrically connected to drain 23 by conducting link 29.

The conducting links 26 connect the two transistors in the lower semiconductor level in a rectangular, closed loop configuration and the link 29 connects the two transistors in the upper semiconductor layer in an open loop, U-shape configuration. The closed and open loops contact at a zone 40 where a window is formed through gate oxide which insulates the lower semiconductor layer from the upper semiconductor layer.

Figure 2:
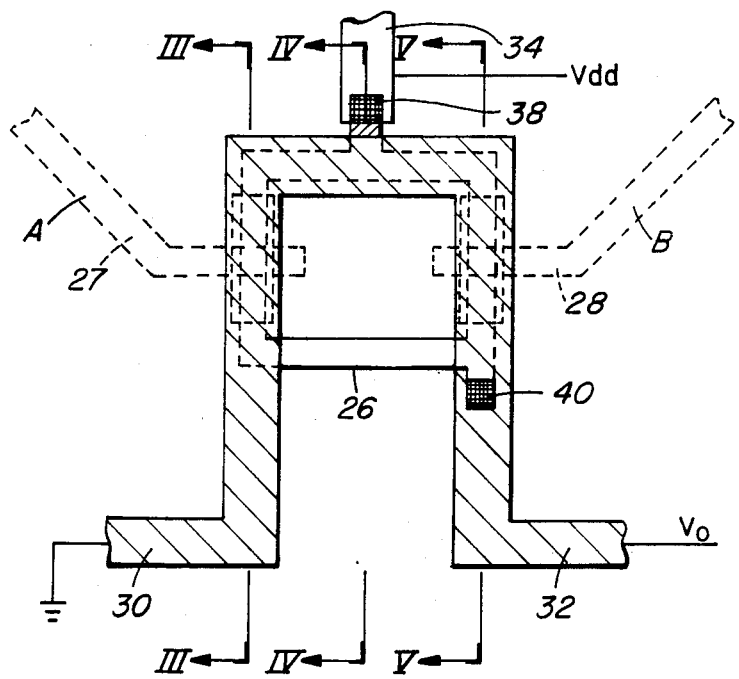
FIG. 2 is a plan view of a NAND gate according to the invention.
Figure 3:
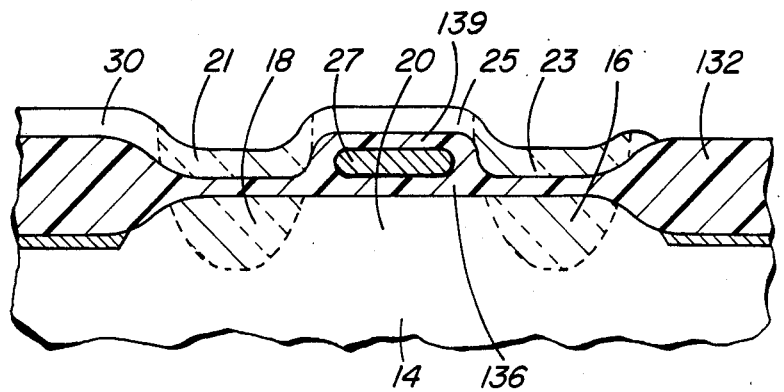
FIG. 3 is a part fragmentary; sectional view on the line III—III of FIG. 2.
Figure 4:
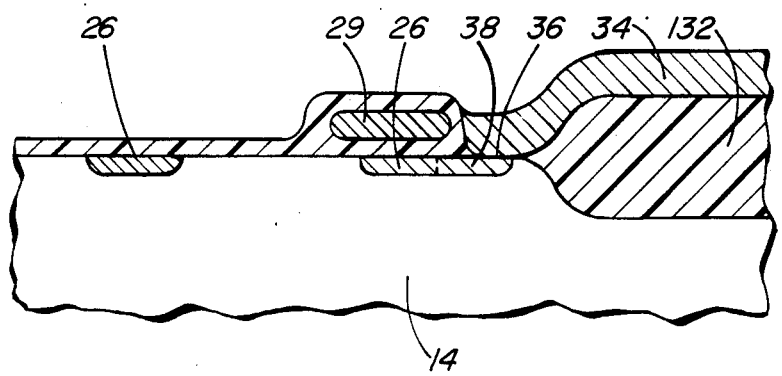
FIG. 4 is a part fragmentary sectional view on the line IV—IV of FIG. 2.
Figure 5:
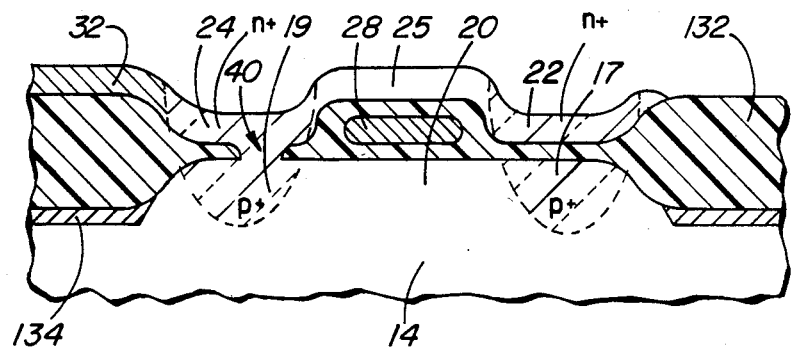
FIG. 5 is a part fragmentary sectional view on the line V—V of FIG. 2.

In use, positive supply voltage $V_{dd}$ and GROUND are applied respectively to leads 34 and 30 as indicated in FIG. 2 and logic 1 or logic 0 input voltages are applied to gates A and B.

An output voltage $V_O$ is taken on lead 32 from the drain 24 at a location overlying the contact zone 40. With the connections indicated in FIG. 2, the two transistors at the lower substrate level are essentially connected in parallel between positive supply voltage $V_{dd}$ and an output terminal $V_O$. The two transistors at the higher semiconductor level are connected in series between GROUND and the output terminal $V_O$. The gates A and B determine whether the pairs of transistors respectively will conduct or not. It can be seen that the NAND gate in FIG. 2 is functionally equivalent to the schematic diagram shown in FIG. 1. Thus referring to the truth table above, according to the logic conditions on A and B the output terminal will have a corresponding logic 1 or 0 output.

Figure 6:
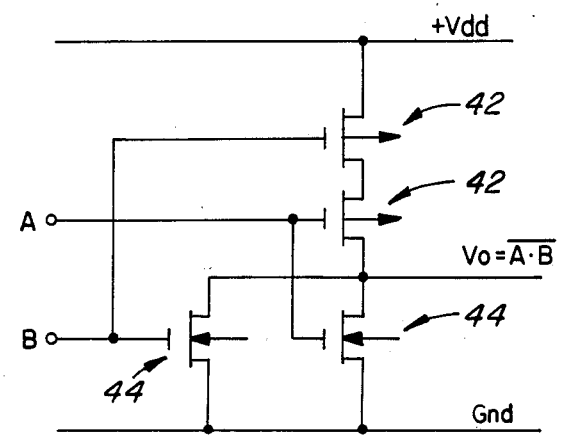
FIG. 6 is a circuit diagram of a two-input NOR gate.
Figure 7:
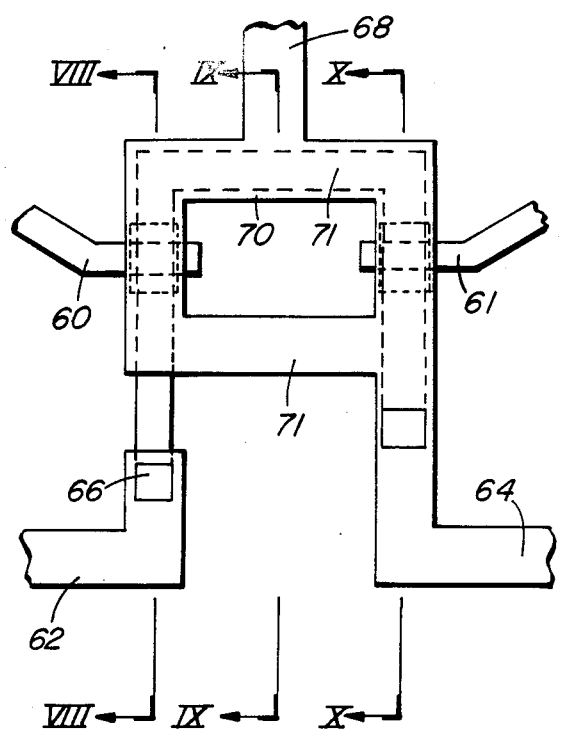
FIG. 7 is a plan view of a NOR gate according to the invention.
Figure 8:
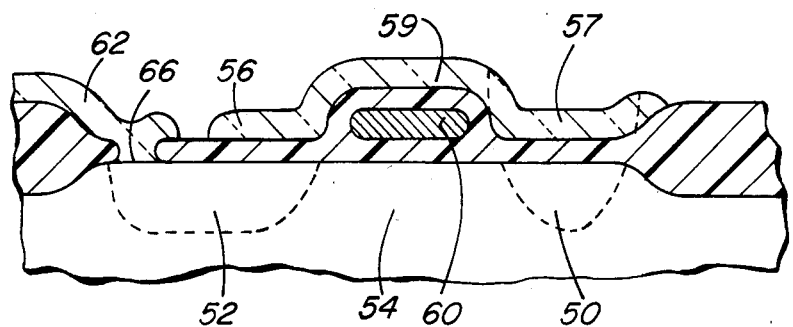
FIG. 8 is a sectional view on the line VIII—VIII of FIG. 5.

Referring to FIG. 6, there is shown a circuit diagram of a NOR gate. Two PMOS transistors 42 are connected in series between a voltage supply rail $V_{dd}$ and an output terminal $V_O$. Two NMOS transistors 44 are connected in parallel between GROUND and $V_O$. The transistors are controlled by voltages A and B applied to their gates. As shown by the truth table below, the output voltage $V_O$ depends on the gate voltages as follows:

| A | B | $V_0$ |
|---|---|---|
| 0 | 0 | 1 |
| 0 | 1 | 0 |
| 1 | 0 | 0 |
| 1 | 1 | 0 |

Referring to FIGS. 7 to 10 there is shown a stacked, vertically integrated implementation of the FIG. 6 NOR circuit. The NOR logic gate has two transistors formed within the semiconductor substrate, the transistors having sources 50, 51 and drains 52, 53 linked by channel regions 54. An upper semiconductor layer has two transistors with sources 55, 56 and drains 57, 58 linked by channel regions 59. At a level intermediate the transistors, insulated control gates 60, 61 extend between the channel regions of the respective transistor pairs. In the upper semiconductor level, doped conducting regions 62, 64 form leads respectively to the drain 52 through window 66 and to drain 58. A third lead 68 is connected to a conducting link which interconnects upper source regions 55 and 57. Conducting links 67, 69 connect the two transistors in the upper semiconductor level in a closed loop rectangular configuration and conducting link 73 connects the two transistors in the lower semiconductor layer in an open loop U-shape configuration. The closed and open loops contact at a zone 63 aligned with the drains 53 and 58.

In use, GROUND and voltage supply $V_{dd}$ are applied to gates 60 and 61 and to leads 62 and 68 as indicated and an output voltage $V_O$ is presented on lead 64.

FIGS. 1 to 10 show arrangements which are adapted to function as two-input logic gates. A practical requirement exists for multiple input NAND and NOR gates.

Figure 11:
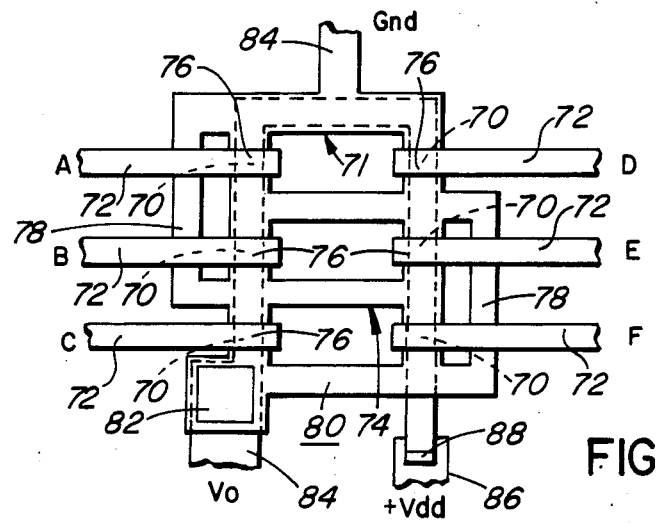
FIG. 11 is a plan view of a six-input NOR gate acording to the invention.

One example of a multiple input NOR gate is shown in plan view in FIG. 11. In this arrangement, six series connected transistors 70 are formed within the substrate semiconductor in a U-configuration 71. A series of laterally extending insulated gates 72 are then formed over the inverted U-configured open loop and an overlying semiconductor layer is configured into a ladder formation 74 having a series of transistors 76 vertically coincident with the transistors 70 in the substrate semiconductor. The ladder configured semiconductor region has side spans 78 which interconnect alternating rungs 80 of the ladder configuration. Contact between the inverted U-and ladder configured semiconductor regions is established at a buried contact 82. Highly doped extensions 84 of the polysilicon region provide leads. A further aluminum lead 86 is connected to one end of the open inverted U-configuration through a window 88 in the oxide layer. The effect of the conducting spans 78 interlinking the alternate rungs 80 of the ladder formation semiconductor is to connect the transistors 76 of the upper layer in parallel, the transistors in the substrate U-configuration being connected in series.

Figure 12:
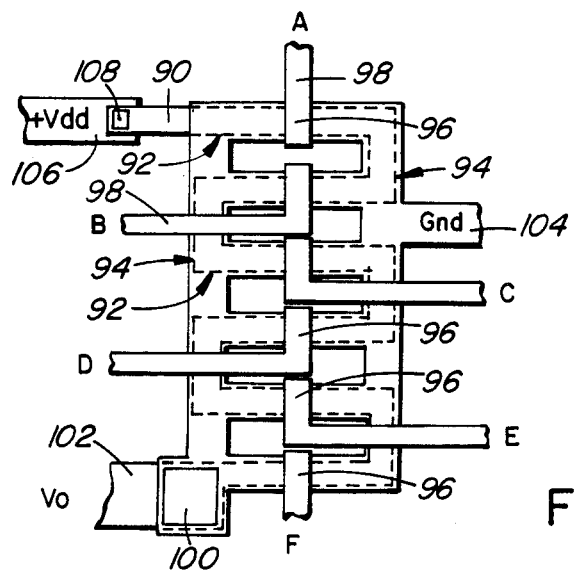
FIG. 12 is a plan view of an alternative configuration of a six-input NOR gate.

Referring to FIG. 12, an alternative configuration for a six-input NOR gate is shown. Here, an open loop 90 within the substrate semiconductor is configured in a serpentine fashion having lateral sections 92 and longitudinally extending sections 94. All vertically coincident transistor pairs 96 are formed in the lateral sections, the channel regions of the transistor pairs being vertically aligned with common control gates 98 which either extend from the side and are angled to cross over the transistor channels as in the case of gates B, C, D and E or, as in the case of gates A and F, extend directly from ends of the logic gate structure to cross the end sections 92. A contact window 100 exists between the two semiconductor layers to provide connection between the loops and an output lead 102. A doped semiconductor ground lead 104 extends to, and is integral with, the top semiconductor layer to connect the upper transistors in parallel. An aluminum lead 106 supplies voltage $V_{dd}$ to the other end of the open loop semiconductor through a window 108 in the oxide layer thereby connecting the lower transistors in series.

Figure 13:
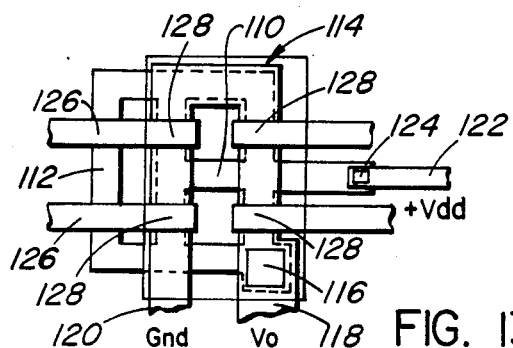
FIG. 13 is a plan view of a four-input NAND gate according to the invention.
Figure 14:
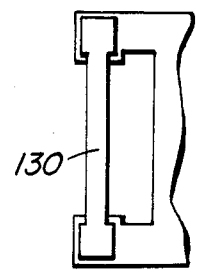
FIG. 14 is a plan view of part of the FIG. 13 logic gate showing an alternative input arrangement.
Figure 15:
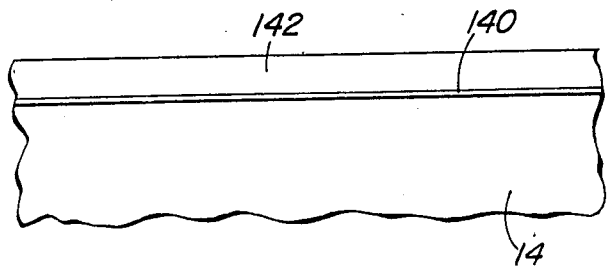
FIGS. 15 to 29 shows successive stages in the fabrication of a logic gate using a process according to the invention.

Turning to FIG. 13, a four-input NAND gate is shown. The logic gate configuration is similar to that of FIG. 11 except that a ladder configuration 110 with additional spans 112 connecting alternate rungs of the ladder is formed in the substrate silicon and the open inverted U-configured loop 114 is formed in the second semiconductor layer. A window 116 provides electrical contact between a heavily doped region 118 of the second semiconductor layer functioning as an output lead, and the drains of two vertically coincident transistors. GROUND is applied to the other end of the open loop by means of a further portion 120 of the upper semiconductor layer which is rendered highly conducting. A voltage supply $V_{dd}$ is applied to the substrate semiconductor configuration using an aluminum lead 122 which contacts the substrate semiconductor through a window 124 within an intermediate layer of oxide. Control gates 126 extend laterally between the two semiconductor layers, transistors 128 being defined by doped regions within the top and bottom semiconductor layers respectively on either side of the gate or channel regions.

Figure 9:
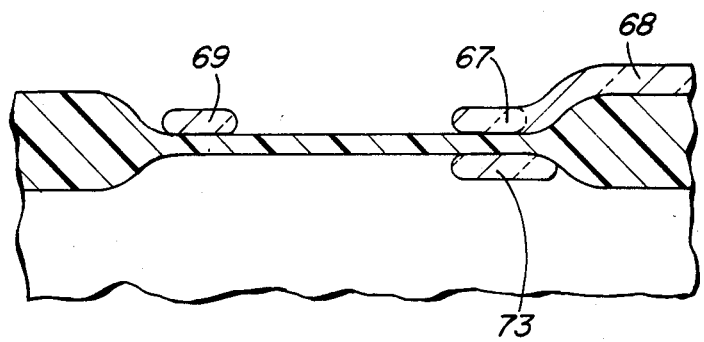
FIG. 9 is a sectional view on the line IX—IX of FIG. 7.
Figure 10:
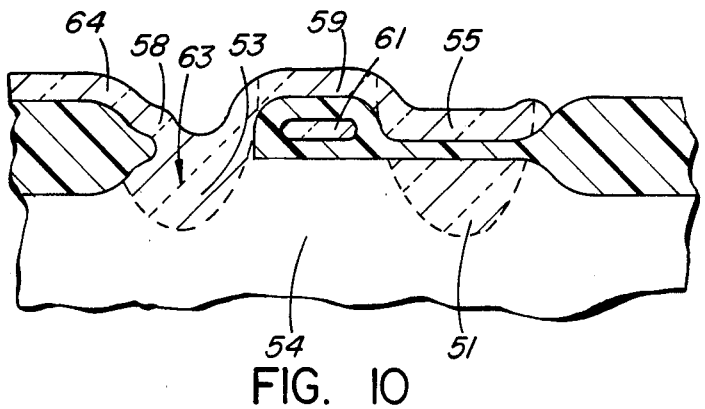
FIG. 10 is a sectional view on the line X—X of FIG. 7.

In an alternative arrangement of the FIG. 9 logic gate shown in FIG. 10, the logic gate is similar in all respects to the FIG. 9 embodiment except that a conducting path 112 between the alternating rungs of the ladder configuration in the substrate semiconductor layer is provided by an aluminum link 130 which is deposited on an oxide overlying the gate and contacts the opposed ends of the span through a window in the intervening oxide layer.

A method for making the NAND logic gate of FIGS. 2 to 5 will now be described. Essentially the method is an extension of that method described in our co-pending U.S.patent application Ser. No. 611,549 filed May 17, 1984.

Referring again to FIGS. 3 to 5, the stacked NAND gate has a p-type silicon substrate 14. A device well extends between field oxide regions 132 which are underlain by relatively conducting regions 134. Within the substrate are n+-type source and drain regions 16, 18, 17, 19 which extend between channel regions 20. Overlying the substrate within the device well is a first gate oxide layer 136, recrystallized polysilicon gates 27, 28 and a second gate oxide layer 139 which extends over the field oxide and device well and is interrupted only at the location 40. Overlying the gate oxide is a recrystallized polysilicon layer which has n-type channel regions 25 overlying the gates 27, 28 and p+-type source and drain regions 21, 22, 23, 24. Overlying the top channels are anti-diffusion oxide and phosphorus silicate glass (PSG) layers, respectively 154 and 156.

Figure 16:
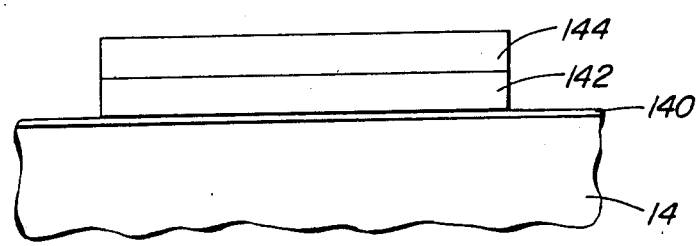
Figure 17:
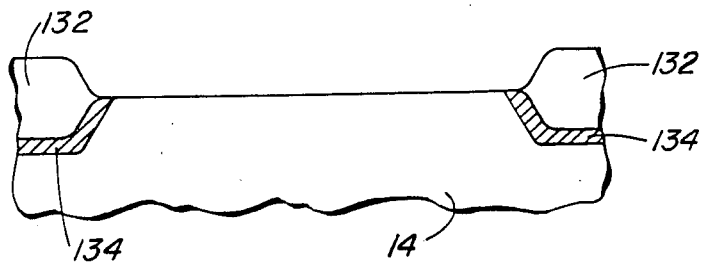
Figure 18:
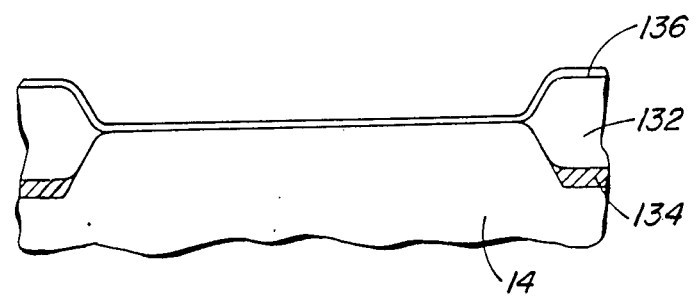

Referring specifically to the processing drawings of FIG. 15 to 29, FIG. 15 shows a p-type <100>6–10 ohm-cm silicon substrate 14 the substrate resistivity of which is made suitable for CMOS devices by implanting boron ions with ion energy 120 keV and a dose of $2.5 \times 10^{11}$ ions/cm$^2$. A 1200 angstrom unit layer 140 of silicon nitride and a resist layer 142 are deposited and photoengraved using a mask 144 which defines a device well, (FIG. 16). The substrate is then subjected to a further boron ion implantation step using ions of energy 50 keV and a dose of $3 \times 10^{13}$ ions/cm$^2$ and then a 0.5 micron layer of field oxide 132 is thermally grown (FIG. 17). This produces p-type conducting regions 134 underlying field oxide regions 132 to isolate subsequently formed n-type devices and ensure also that parasitic capacitance and transistor action do not occur outside the device wells.

Figure 19:
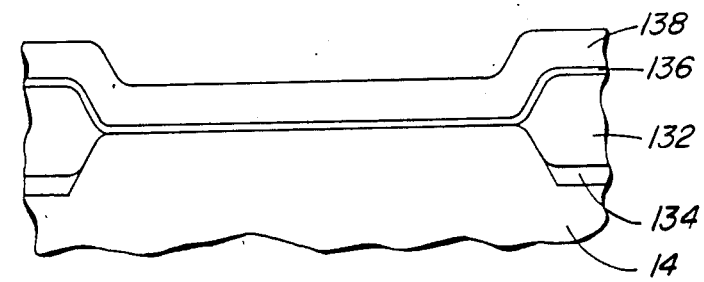

Following removal of the nitride 140, a first gate oxide layer 136 of 500 angstrom units is grown over the wafer (FIG. 18) and this is followed by a low pressure chemically vapour deposited layer 138 of polycrystalline silicon or polysilicon (FIG. 19). This gate polysilicon layer is rendered highly conducting firstly by subjecting the polysilicon to a POCl$_3$ atmosphere for 30 minutes at 900° C. and then laser recrystallizing the layer using a 50 micron diameter argon laser beam with an output power of 7.5 watts and a scanning rate of 50 cm/sec. During this step the n-type phosphorus dopant is distributed throughout the polysilicon and the top surface of the polysilicon is prepared for further oxide growth.

Figure 20:
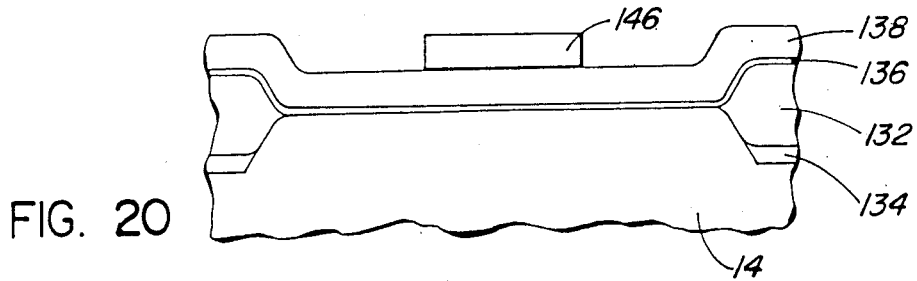
Figure 21:
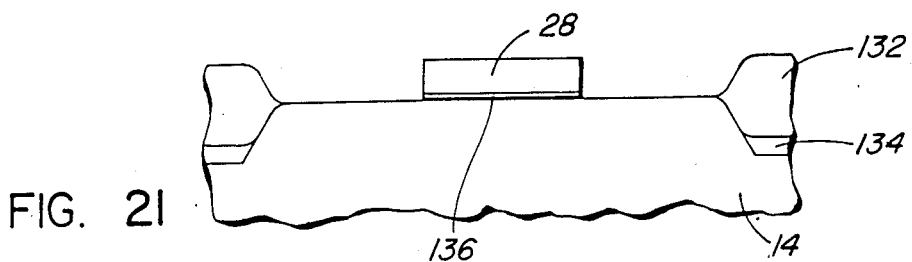
Figure 22:
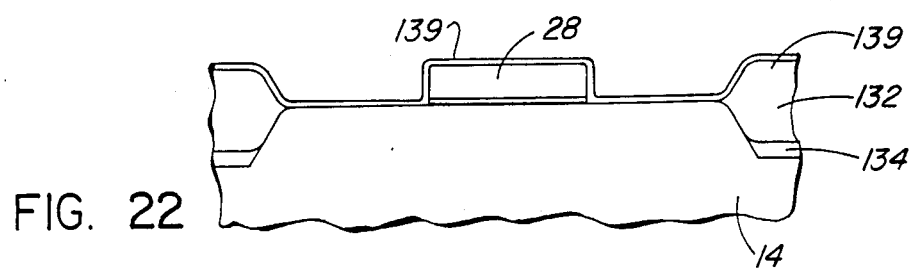
Figure 23:
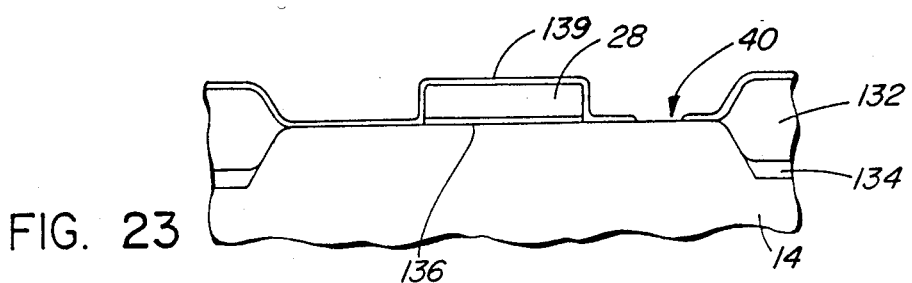

Using a second mask 146, the wafer is etched to remove the recrystallized polysilicon and the underlying oxide except at gate regions 27, 28 and at leads 30, 32 extending away from the gates (FIGS. 20, 21). A second gate oxide layer 139 of 500 angstrom units is then thermally grown over the wafer and using a third mask a contact window 40 is made to the substrate (FIGS. 22, 23).

Figure 24:
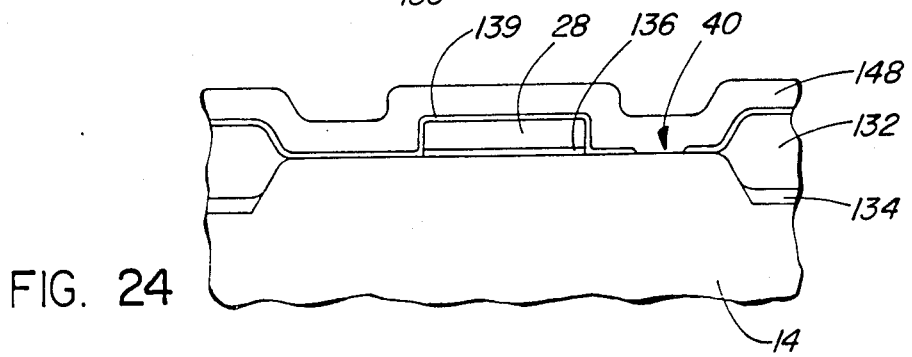

A second polysilicon layer 148 is then low pressure chemically vapour deposited to a depth of 0.25 microns (FIG. 24). The voltage threshold of the top or complementary transistors being formed are then set by implanting into the layer boron ions at an energy of 100 keV with a dose density of $2 \times 10^{11}$/cm$^2$.

Figure 25:
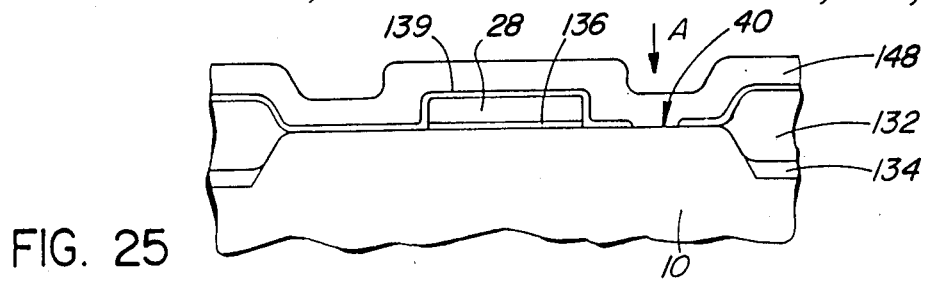
Figure 26:
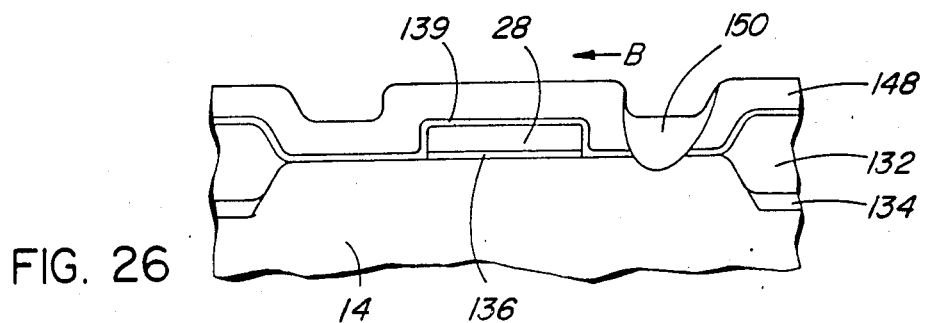

To promote lateral seeding of the upper crystalline layer from the underlying silicon bulk substrate, the polysilicon 148 and part at least of the underlying substrate 14 are melted using an 8 watts continuous wave argon laser beam A of diameter 50 microns and a scanning rate of 50 cm/sec (FIG. 25). When the laser beam is directly over the opening 40, it causes a melt pool 150 to extend down through the polysilicon film 148 and into the single crystal substrate 14. As the laser beam is moved away from the seed window 40 in the direction of arrow B the first region to cool and re-solidify is the single crystal substrate (FIG. 26). The crystallization front then moves up from the substrate 14 and follows the trailing edge of the melt pool 150 across the surface of the oxide layer 139. The result of this process is a continuous film of single crystal silicon with the same crystallographic orientation as that of the substrate 14. High quality thin film transistors can be fabricated in the second substrate which, over most of its area is separated from the original substrate by the gate oxide layer 139. A particular advantage of the open/closed loop form of the logic gates disclosed in this application is that the distance between the seeding window 40 and parts of the polysilicon film 148 being rendered single crystal is minimized.

Essential to such lateral seeding is the seeding window 40 through which the lateral seeding process can start. Because well ordered crystallization can only proceed for a limited lateral distance of about 50 microns from the seed window, the location of the window in relation to the active channel regions of the transistors is important. The extent to which lateral crystallization takes place is also influenced by the topography of the structure and thus large steps in the structure beneath the polysilicon layer 148 are avoided.

The recrystallization of silicon films is dependent also on the difference in temperature encountered by the polysilicon film 148 when it is on top of a relatively thick field oxide 132, as compared to the temperature experienced within the device wells. Because of the thermal insulating properties of the field oxide 132, the polysilicon over the field oxide can become too hot for the condition required to produce a deep melt within the substrate 14 which is needed for lateral seeding. To overcome this problem, one alternative is to use an anti-reflection coating over the polysilicon film in the device well in a technique known as selective laser annealing (SLA) and described in our co-pending U.S. patent application Ser. No. 430,698, filed June 17, 1983. In the application to vertically integrated devices, SLA introduces several additional photoengraving steps with the consequent risk of misalignment problems. Moreover to achieve good recrystallization of polysilicon films on top of oxide, the center of the region which is to be recrystallized should be cooler than the edges. If a single anti-reflective coating is used, this cannot be the case. The film must therefore be selectively placed or vary in reflectivity over its area. The problem of large temperature difference of the polysilicon over the field oxide 132 compared with the laterally adjacent polysilicon can alternatively be solved by using a thin field oxide layer which is so thin, of the order of 0.5 microns, that the thermal insulation effect is minimized while acceptable electrical isolation between devices is maintained. It is noted that in standard MOS processing a field oxide layer of a thickness greater than 1 micron is common.

Figure 27:
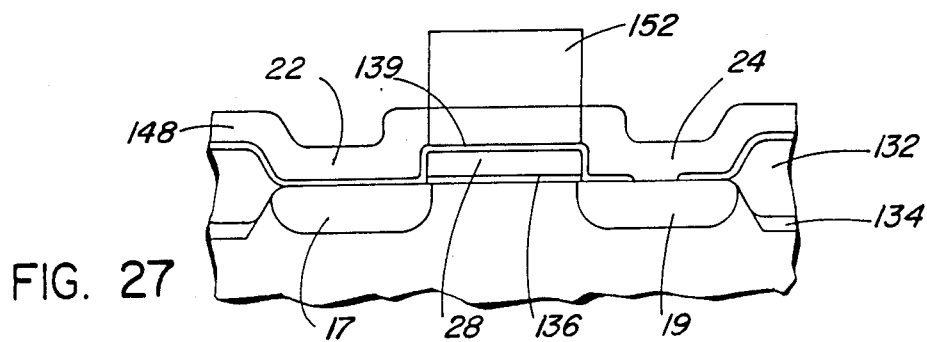

Following lateral seeding of the layer 148, a further photoengraving mask 152 is used in order to define source regions and drain regions of the eventual logic gate transistors (FIG. 27). Three ion implantation steps are performed:

Firstly, phosphorus ions with an energy of 300 keV and a dose of $1 \times 10^{16}$ ions/cm$^2$;

Secondly, boron ions with an energy of 40 keV and a dose of $1 \times 10^{16}$ ions/cm$^2$; and Finally, boron ions with an energy of 20 keV and a dose of $1 \times 10^{14}$ ions/cm$^2$.

The implanted ions are subsequently rendered active by a laser annealing step with a beam diameter of 50 microns, an output power of 5 watts and a scan rate of 50 cm/sec to produce substrate and upper semiconductor layer sources and drains. These two steps also render the interconnect regions of the polysilicon layer highly conducting.

Figure 28:
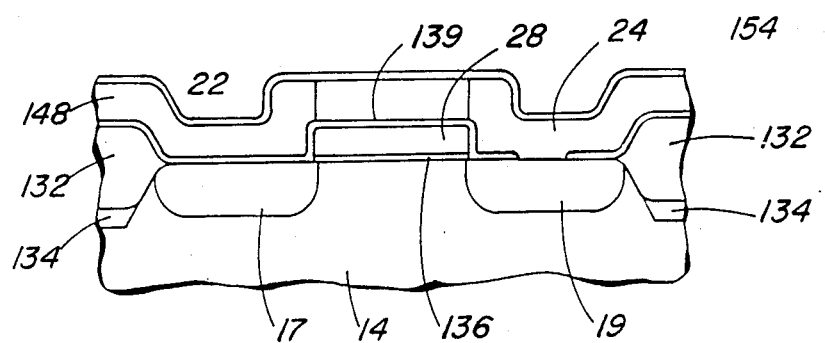
Figure 29:
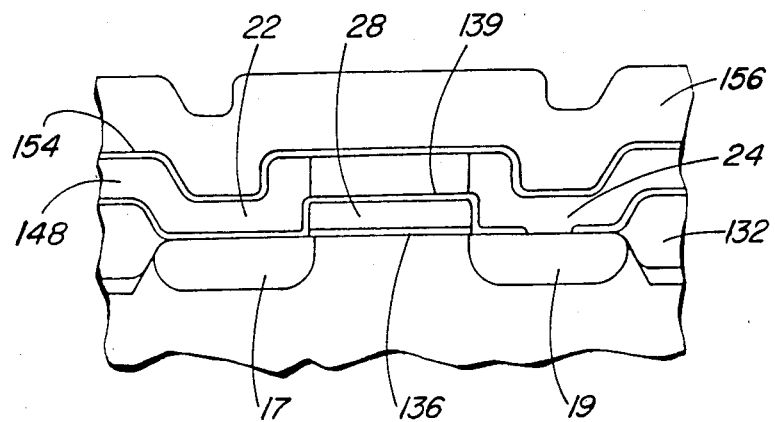

After the source and drain implants, a fifth mask (not shown) is produced over the wafer and those areas of the polysilicon layer 148 which are not required for the upper transistors, the bridging portion 29, and the leads 30, 32 are etched away. A 200 angstrom units thick layer 154 of oxide is then thermally grown and functions to prevent phosphorus diffusion from a subsequently deposited layer 156 of phosphorus silicate glass (PSG) (FIGS. 28 and 29).

Using a further mask, contact windows are opened through the phosphorus silicate glass to expose the ends of the polysilicon leads 30, 32 and to expose an extension 38 of the highly conducting bridge portion 29 within the substrate 14. Using a further mask aluminum 34 is deposited through to the polysilicon interconnects or leads 30, 32 and to the substrate at the bridge poriton 29. Lastly a Pyrox (Trade Mark) layer is deposited over the wafer to provide scratch protection, and bonding pad windows are opened using a final, eighth mask.

Using the method of the invention and the dual loop mapping of the NAND and other logic gates, it can be seen that the particular ordering of process steps provides a high degree of lateral seeding from the substrate single crystal silicon while preventing undesired diffusion of dopants from previously formed source and drain regions.

Compared with two-dimensional or non-stacked CMOS logic gates a large saving in area accrues because the complementary transistors need not be built into an area consuming tub. Moreover the speed of the structure is high because of a reduction in parasitic capacitance ensured by minimizing the areas where interconnects lie over bulk silicon. As indicated previously, a further important aspect of the stacked or vertically integrated CMOS structures is that they are latch-up free. This has been a common problem for VLSI CMOS circuits. It is also noted that the number of photoengraving steps for the stacked structures shown is eight whereas a typical number of process steps used in the manufacture of simple non-stacked CMOS logic gates required eleven steps.

Although the description relates specifically to fabrication of NAND or NOR gates, the process can be used with some slight modification for the manufacture of logic circuits combining NAND and NOR gates. Also, although the description specifically describes PMOS transistors built above NMOS transistors, the reverse, (NMOS above PMO's) is equally feasible by using an n-type substrate and implants of dopant type opposite to those described above.

What is claimied is:

1. A vertically integrated MOS logic gate comprising first and second active semiconductor layers, one of the active semiconductor layers having an open loop with a pair of parallel legs and an interconnecting portion extending between said parallel legs, said open loop being formed by at least two transistors, one of said transistors having a source region, a channel region and a drain region positioned along one of said parallel legs and the other of said transistors having a source region, a channel region and a drain region positioned along the other of said parallel legs, and the other active semiconductor layer having at least one closed loop in which are formed a plurality of transistors, the transistors in one semiconductor layer being substantially vertically aligned with respect to transistors in the other semiconductor layer and having respective common control gates located between the layers, each control gate controlling one vertically coincident transistor pair, each transistor in said closed loop having a source and a drain region separated by a channel region, at least one of the vertically aligned transistor pairs having drain regions contacting one another at a contact zone, a first and a second lead connected to the open loop to connect the open loop transistors in series, and a third and a fourth lead connected to the or each close loop to connect the closed loop transistors in parallel.

2. A vertically integrated MOS logic gate as claimed in claim 1 in which the second and the fourth leads form a common output lead.

3. A vertically integrated MOS logic gate as claimed in claim 2 in which the output lead is connected to the loops at or near the contact zone.

4. A vertically integrated MOS logic gate as claimed in claim 1 in which the first semiconductor layer is a top layer within a semiconductor substrate and the second semiconductor layer is a film of recrystallized polycrystalline material.

5. A vertically integrated MOS logic gate as claimed in claim 4 in which the semiconductor is silicon.

6. A vertically integrated MOS logic gate as claimed in claim 1 in which the open loop is configured as a U-shape and the or each closed loop is rectangular.

7. A vertically integrated MOS logic gate as claimed in claim 1, the logic gate having multiple inputs, the open loop having a rectangular serpentine configuration and a plurality of such closed loops being configured as a ladder formation.

8. A vertically integrated MOS logic gate as claimed in claim 1 the logic gate having at least one rectangular closed loop and a U-shaped open loop, opposed limbs of the rectangular loop being vertically aligned with the opposed limbs of the U-shaped loop.

9. A vertically integrated MOS logic gate as claimed in claim 8 in which the control gates extend orthogonally to the opposed limbs of the U- and rectangular loops.

10. A vertically integrated MOS logic gate as claimed in claim 1, the logic gate particularly adapted to function as a NAND gate, further comprising means for applying logic input voltages to the respective control gates, means for grounding the first lead, and means for applying a positive logic supply to the third lead, a logic gate output voltage being taken from the second and fourth leads.

11. A vertically integrated MOS logic gate as claimed in claim 1, the logic gate particularly adapted to function as a NOR gate, further comprising means for applying logic input voltages to respective control gates, means for applying positive logic supply to the first lead and means for grounding the third lead, a logic gate output voltage being taken from the second and fourth leads.

12. A vertically integrated MOS logic gate as claimed in claim 1 in which p-channel transistors are formed within the first semiconductor layer and n-channel transistors are formed within the second semiconductor layer.

13. A vertically integrated MOS logic gate as claimed in claim 1 in which n-channel transistors are formed within the first semiconductor layer and p-channel transistors are formed within the second semiconductor layer.

14. A vertically integrated MOS logic gate as claimed in claim 1 in which the commonly controlled transistors are vertically coincident and the control gates are made of polysilicon.

15. A vertically integrated MOS logic gate as claimed in claim 1 particularly adapted for multiple inputs, the logic gate having a plurality of the closed loops configured as a ladder, alternating rungs being connected to the third lead and the remaining rungs being connected to the output lead.

16. A vertically integrated MOS logic gate as claimed in claim 12 in which the second and third leads have portions thereof running parallel to uprights of the ladder configuration.

17. A vertically integrated MOS logic gate as claimed in claim 1 the gate particularly adapted for multiple inputs, a plurality of the closed loops being arranged in a ladder configuration with one upright of the ladder connected to the second lead means and the other upright of the ladder connected to the third lead means, the open loop extending in a serpentine fashion back and forth across the ladder configured closed loops, cross parts of the serpentine configuration being coincident with the rung parts of the ladder configuration and having vertically aligned transistors formed thereat, the control gates having end portions extending perpendicular to the respective rungs and cross pieces.

18. A vertically integrated MOS logic gate as claimed in claim 1 in which the lead means are regions of doped polysilicon formed from a layer of polysilicon integral with the loop or loops formed within the semiconductor film.

19. A vertically integrated MOS logic gate as claimed in claim 1 in which each control gate extends substantially perpendicularly to one of said parallel legs.

* * * * *